(12) United States Patent
Liu et al.

(10) Patent No.: US 11,837,686 B2
(45) Date of Patent: Dec. 5, 2023

(54) OPTICAL DEVICE PACKAGE AND METHOD FOR MANUFACTURING THE SAME

(71) Applicant: Advanced Semiconductor Engineering, Inc., Kaohsiung (TW)

(72) Inventors: Chanyuan Liu, Kaohsiung (TW); Kuo-Hsien Liao, Kaohsiung (TW); Alex Chi-Hong Chan, Kaohsiung (TW); Fuh-Yuh Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 544 days.

(21) Appl. No.: 16/706,527

(22) Filed: Dec. 6, 2019

(65) Prior Publication Data

US 2020/0185581 A1 Jun. 11, 2020

Related U.S. Application Data

(60) Provisional application No. 62/777,032, filed on Dec. 7, 2018.

(51) Int. Cl.
*H01L 27/15* (2006.01)
*H01L 29/26* (2006.01)
(Continued)

(52) U.S. Cl.
CPC .......... *H01L 33/60* (2013.01); *H01L 25/0753* (2013.01); *H01L 33/0095* (2013.01);
(Continued)

(58) Field of Classification Search
CPC . H01L 33/60; H01L 25/0753; H01L 33/0095; H01L 33/52; H01L 33/62;
(Continued)

(56) References Cited

U.S. PATENT DOCUMENTS

| | | | |
|---|---|---|---|
| 6,590,152 B1 * | 7/2003 | Horio | H05K 9/0022 257/E31.118 |
| 7,026,654 B2 * | 4/2006 | Igaki | H01L 31/02325 257/E31.096 |

(Continued)

*Primary Examiner* — Ismail A Muse
(74) *Attorney, Agent, or Firm* — FOLEY & LARDNER LLP

(57) ABSTRACT

An optical device package includes a substrate, a light emitting device, a light detecting device, one or more electronic chips, a clear encapsulation layer and a patterned reflective layer. The substrate has a surface. The light emitting device is disposed on the surface of the substrate, the light detecting device is disposed on the surface of the substrate, and the light emitting device and the light detecting device have a gap. The one or more electronic chips are at least partially embedded in the substrate, and electrically connected to the light emitting device and the light detecting device. The clear encapsulation layer is disposed on the surface of the substrate and encapsulates the light emitting device and the light detecting device. The patterned reflective layer is disposed on an upper surface of the clear encapsulation layer and at least overlaps the gap between the light emitting device and the light detecting device in a projection direction perpendicular to the surface of the substrate.

9 Claims, 21 Drawing Sheets

(51) Int. Cl.
   *H01L 31/12*   (2006.01)
   *H01L 33/00*   (2010.01)
   *H01L 33/60*   (2010.01)
   *H01L 33/52*   (2010.01)
   *H01L 33/62*   (2010.01)
   *H01L 25/075*  (2006.01)

(52) U.S. Cl.
   CPC .............. *H01L 33/52* (2013.01); *H01L 33/62* (2013.01); *H01L 2933/005* (2013.01); *H01L 2933/0058* (2013.01)

(58) Field of Classification Search
   CPC ....... H01L 2933/005; H01L 2933/0058; H01L 33/54; H01L 25/167
   See application file for complete search history.

(56) References Cited

U.S. PATENT DOCUMENTS

| | | | |
|---|---|---|---|
| 10,290,672 B2 | 5/2019 | Kinsman et al. | |
| 11,073,615 B2* | 7/2021 | Chua | G01S 7/4813 |
| 2010/0181578 A1* | 7/2010 | Li | H01L 31/153 |
| | | | 257/E31.095 |
| 2014/0021491 A1* | 1/2014 | Meng | H01L 33/54 |
| | | | 257/82 |
| 2016/0029911 A1* | 2/2016 | Lee | A61B 5/0205 |
| | | | 600/407 |
| 2016/0198962 A1* | 7/2016 | Park | A61B 5/0295 |
| | | | 600/480 |
| 2018/0303359 A1* | 10/2018 | O'Brien | A61B 5/14552 |
| 2019/0079004 A1* | 3/2019 | Ulanch | G01J 3/2823 |
| 2020/0057158 A1* | 2/2020 | Chua | G01S 7/4813 |
| 2020/0241138 A1* | 7/2020 | Allen | G01S 7/481 |
| 2020/0367827 A1* | 11/2020 | Min | A61B 5/6843 |

* cited by examiner

OPTICAL DEVICE PACKAGE AND METHOD FOR MANUFACTURING THE SAME

CROSS-REFERENCE TO RELATED APPLICATIONS

This application claims priority to and the benefit of U.S. Provisional Application No. 62/777,032, filed Dec. 7, 2018, the content of which is incorporated herein by reference in its entirety.

BACKGROUND

1. Technical Field

The present disclosure relates to an optical device package and method for manufacturing the same, more particularly, to an optical device package including light emitting device and light detecting device and method for manufacturing the same.

2. Description of the Related Art

Optical device package normally includes light emitting device and light detecting device electrically cooperatively. The light emitting device and the light detecting device each specifies controller integrated circuits (ICs), and thus the overall size of the optical device package is increased. Optical crosstalk or interference between the light emitting device and the light detecting device is also an issue to be addressed.

SUMMARY

In some embodiments, an optical device package includes a substrate, a light emitting device, a light detecting device, one or more electronic chips, a clear encapsulation layer and a patterned reflective layer. The substrate has a surface. The light emitting device is disposed on the surface of the substrate, the light detecting device is disposed on the surface of the substrate, and the light emitting device and the light detecting device have a gap. The one or more electronic chips are at least partially embedded in the substrate, and electrically connected to the light emitting device and the light detecting device. The clear encapsulation layer is disposed on the surface of the substrate and encapsulates the light emitting device and the light detecting device. The patterned reflective layer is disposed on an upper surface of the clear encapsulation layer and at least overlaps the gap between the light emitting device and the light detecting device in a projection direction perpendicular to the surface of the substrate.

In some embodiments, an optical device package includes a substrate, a light emitting device, a light detecting device, a first electronic chip, a second electronic chip, a clear encapsulation layer, an opaque isolation structure and at least one optical lens. The substrate has a surface. The light emitting device and the light detecting device are disposed on the surface of the substrate. The first electronic chip is at least partially embedded in the substrate, and electrically connected to one of the light emitting device and the light detecting device. The second electronic chip is disposed on the surface of the substrate, and electrically connected to the other one of the light emitting device and the light detecting device. The clear encapsulation layer is disposed on the surface of the substrate and encapsulates the light emitting device and the light detecting device. The opaque isolation structure is disposed between the light emitting device and the light detecting device. The at least one optical lens is disposed on at least one of the light emitting device and the light detecting device.

In some embodiments, a method of manufacturing an optical device package includes following operations. A substrate including one or more circuit layers and at least one embedded electronic chip is provided. A first optical device and a second optical device are disposed on the substrate and electrically connected to the one or more circuit layers. The first optical device and the second optical device are encapsulated with a clear encapsulation layer. A patterned reflective layer is formed on the clear encapsulation layer and at least substantially aligned with a gap between the first optical device and the second optical device.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 1O is a schematic cross-sectional view of an optical device package in accordance with some embodiments of the present disclosure.

DETAILED DESCRIPTION

Figure 1A:
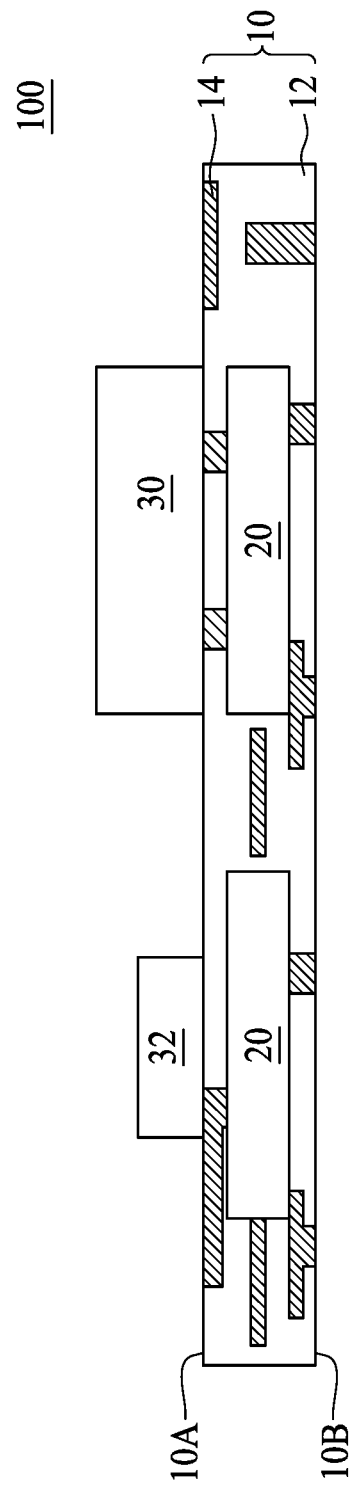
FIG. 1A is a schematic cross-sectional view of an optical device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Some embodiments of the present disclosure provide optical device packages and methods for manufacturing the same. The optical device package includes a substrate having one or more circuit layers, one or more electronic chips embedded in the substrate and electrically connected to the circuit layers, and one or more optical devices disposed on the substrate and electrically connected to the electronic chips through the circuit layers. The electronic chips may include, but are not limited to, active electronic chips such as micro control unit (MCU) chips, memory chips, signal processing units or the like, passive electronic chips such as resistors, inductors, capacitors, or a combination thereof. The optical devices may include, but are not limited to, light emitting devices, light detecting devices, a combination thereof, or other suitable optical devices. The embedded electronic chips can reduce the volume and thickness of the optical device package, shorten electrical path between the electronic chip and the optical device, and increase thermal dissipation of the optical device package. The optical device package may further include a clear encapsulation layer encapsulating the optical device. The clear encapsulation layer can protect the optical device, and enhance thermal dissipation of the optical device package. The optical device package may further include an opaque isolation structure for providing optical and/or electrical isolation between different optical devices. The optical device package may further include a patterned reflective layer partially interfacing the clear encapsulation layer. The patterned reflective layer can reduce secondary light reflection in some embodiments, or alternatively provide a reflection path to deliver the light beams emitted from one optical device such as light emitting device to another optical device such as light detecting device for feedback control.

The optical device packages may be used in different applications such as in lighting application, sensor application, display application, automotive application or other suitable applications. By way of examples, the optical device package may be utilized in lamp, vehicle headlight, night vision system, pre-crash warning, traffic sign recognition, intelligent light control, rain sensor, blind spot detection, park assistant, lane departure warning, light detection and ranging (LIDAR) system, autopilot or the like.

FIG. 1A is a schematic cross-sectional view of an optical device package 100 in accordance with some embodiments of the present disclosure. As shown in FIG. 1A, an optical device package 100 includes a substrate 10, one or more electronic chips 20 and one or more optical devices 30. The substrate 10 may include a circuit substrate including a surface 10A (e.g., a first surface), and another surface 10B (e.g., a second surface) opposite to the surface 10A. The substrate 10 includes one or more circuit layers 14. The circuit layers 14 may be stacked to one another, and dielectric layer(s) 12 may be interposed between adjacent circuit layers 14. The circuit layers 14 may include redistribution layers (RDLs), conductive vias, conductive pads, or a combination thereof. The dielectric layers 12 may include inorganic material, organic material, semiconductor material, solder mask or other suitable materials. In some embodiments, an upmost circuit layer 14 and a bottommost circuit layer 14 are at least partially exposed from the substrate 10 for internal or external electrical connection. In some embodiments, the substrate 10 may include a semiconductor-based circuit substrate. For example, the substrate 10 may include base material such as semiconductor material, dielectric material such as inorganic and/or organic dielectric material, and conductive material such as metal, and formed by semiconductor processes.

The electronic chips 20 can be at least partially embedded in the substrate 10 during fabrication of the substrate 10. In some other embodiments, the substrate 10 may include a lead frame with circuit layers 12 and dielectric layers 14 formed thereon. The electronic chips 20 can be embedded during fabrication of the substrate 10. Heat generated during operation of the electronic chips 20 embedded in the substrate 10 can be dissipated directly from the surface 10B through the circuit layer(s) 14, and thus heat dissipation can be improved. The embedded electronic chips 20 also help to miniaturize the package size of the optical device package 100, and thus increase application variety of the optical device package 100.

The electronic chips 20 may be entirely or partially embedded in the substrate 10. The electronic chips 20 may include, but are not limited to, active electronic chips such as micro control unit (MCU) chips, memory chips, signal processing units or the like, integrated passive electronic chips such as resistors, inductors, capacitors, or a combination thereof. The electronic chips 20 are electrically connected to the optical devices 30 through the circuit layers 14 to provide signals to the optical devices 30 and/or to receive signals from the optical devices 30.

The optical devices 30 are disposed on or adjacent to the surface 10A of the substrate 10, and electrically connected to the electronic chips 20 through at least a portion of the circuit layers 14. The optical devices 30 may include, but are not limited to, light emitting devices, light detecting devices, a combination thereof, or other suitable optical devices. The light emitting device may be configured to emit visible light beams, invisible light beams such as IR beams or UV beams, laser beams or light beams in other wavelength ranges. Examples of the light emitting devices may include, but are not limited to, light emitting diode (LED), organic light emitting diode (OLED) or the like. The light detecting device may be configured to detect light beams within invisible light wavelength ranges, visible light wavelength ranges or other predetermined wavelength ranges. Examples of the light detecting devices may include photo diode (PD), charge-coupled device (CCD), Complementary Metal-Oxide Semiconductor (CMOS) device or the like. In some embodiments, the optical devices 30 may include surface mount devices (SMDs) and formed on the surface 10A of the substrate 10 by surface mounting technology (SMT). For example, the optical device package 100 may include flip chip (FC) package, and package size can be reduced.

As shown in FIG. 1A, the embedded electronic chips 20 and the optical devices 30 are in electrical communication with each other directly through the circuit layer(s) 14 interposed therebetween, and thus the electrical path is short and direct. Accordingly, the electrical performance of the optical device package 100 is improved.

In some embodiments, electronic component 32 can be optionally disposed on the surface 10A or the surface 10B of the substrate 10 and electrically connected to the electronic chips 20 through the circuit layers 14. The electronic component 32 may include passive electronic component including resistors, inductors or capacitors, active electronic component, or a combination thereof. In some embodiments, the substrate 10 can be mounted on a printed circuit board (PCB) or the like from the surface 10B through electrical conductors such as solder balls.

The optical device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 1B:
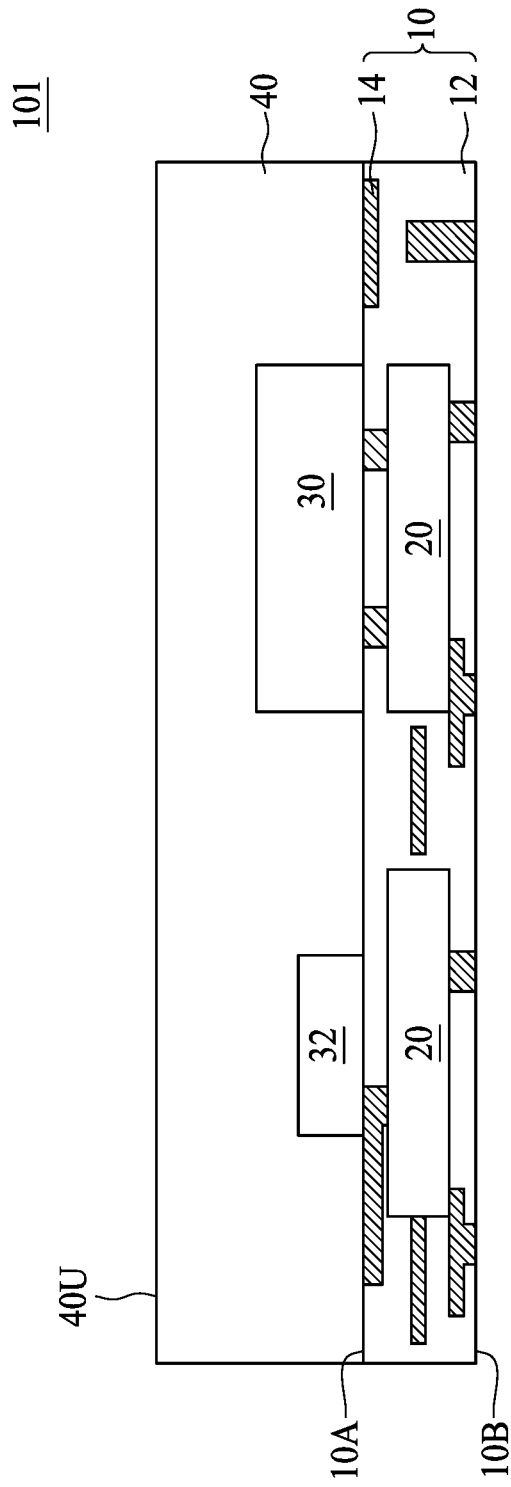
FIG. 1B is a schematic cross-sectional view of an optical device package in accordance with some embodiments of the present disclosure.

FIG. 1B is a schematic cross-sectional view of an optical device package 101 in accordance with some embodiments of the present disclosure. As shown in FIG. 1B, in contrast to the optical device package 100 of FIG. 1A, the optical device package 101 may further include a clear encapsulation layer (also referred to as clear compound) 40 disposed on the surface 10A of the substrate 10, and encapsulating the optical devices 30 and the electronic component 32 (if exists). The clear encapsulation layer 40 may include molding material such as epoxy-based material (e.g. FR4), resin-based material (e.g. Bismaleimide-Triazine (BT)), Polypropylene (PP)), molding compound or other suitable materials. The clear encapsulation layer 40 may be substantially filler-free to pass light beams. In some embodiments, the thermal conductivity of the clear encapsulation layer 40 is larger than air, and thus heat dissipation of the optical devices 30 can be improved. In some embodiments, an upper surface 40U of the clear encapsulation layer 40 is substantially flat.

Figure 1C:
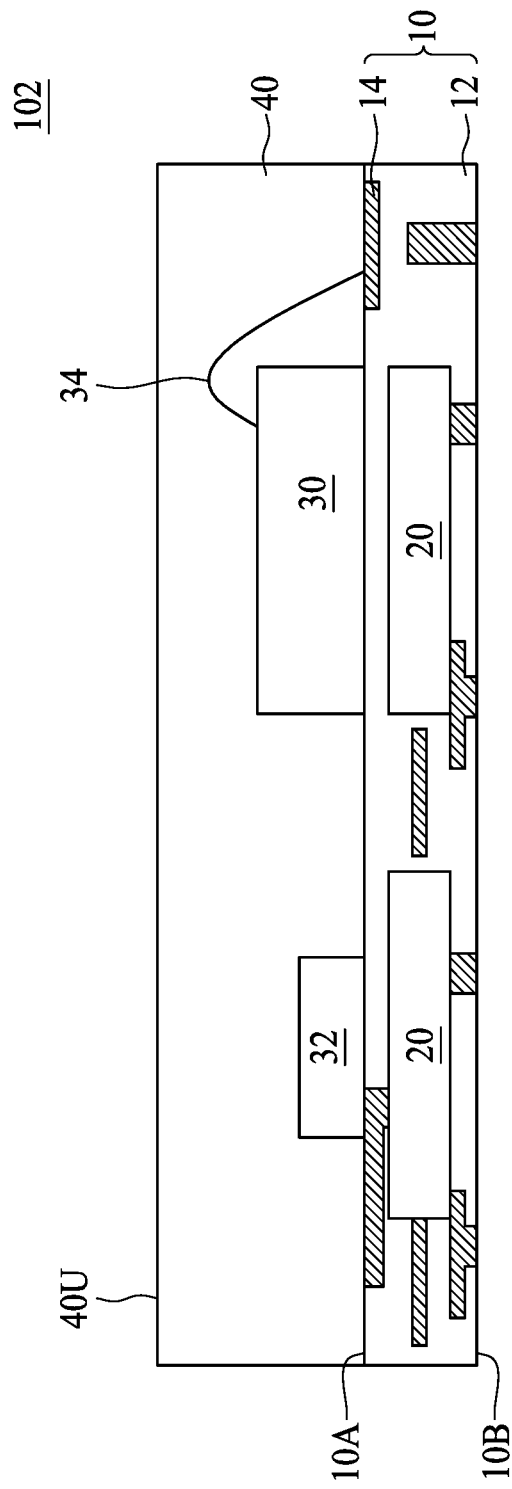
FIG. 1C is a schematic cross-sectional view of an optical device package in accordance with some embodiments of the present disclosure.

FIG. 1C is a schematic cross-sectional view of an optical device package 102 in accordance with some embodiments of the present disclosure. As shown in FIG. 1C, in contrast to the optical device package 101 of FIG. 1B in which the optical device 30 is SMD, the optical device 30 of the optical device package 102 may be electrically connected to the circuit layer 14 by wire bonding through conductive wires 34. The clear encapsulation layer 40 may encapsulate the conductive wires 34 to protect the conductive wires 34. The optical device 30 can be electrically connected to the circuit layer 14 by SMT, wire bonding or other suitable techniques.

Figure 1D:
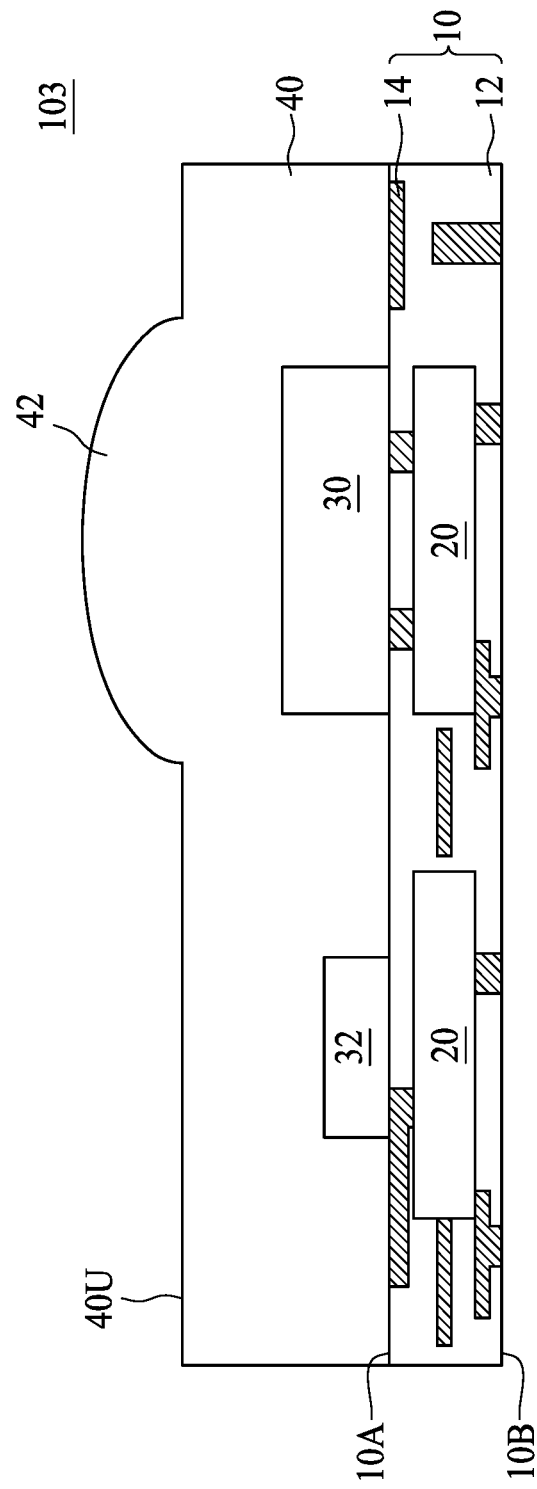
FIG. 1D is a schematic cross-sectional view of an optical device package in accordance with some embodiments of the present disclosure.

FIG. 1D is a schematic cross-sectional view of an optical device package 103 in accordance with some embodiments of the present disclosure. As shown in FIG. 1D, in contrast to the optical device package 101 of FIG. 1B, the clear encapsulation layer 40 of the optical device package 103 may further include one or more optical lenses 42 extending from the upper surface 40U of the clear encapsulation layer 40. In some embodiments, the optical lenses 42 are substantially aligned with the optical devices 30, respectively. The optical lenses 42 and the clear encapsulation layer 40 may be formed monolithically and integrally, for example, by the same molding process. In some other embodiments, the optical lenses 42 and the clear encapsulation layer 40 may be formed separately and bonded to each other by optical adhesive for example. The optical lenses 42 may have a convex or concave curvature, to focus or spread the light beams of the optical devices 30.

Figure 1E:
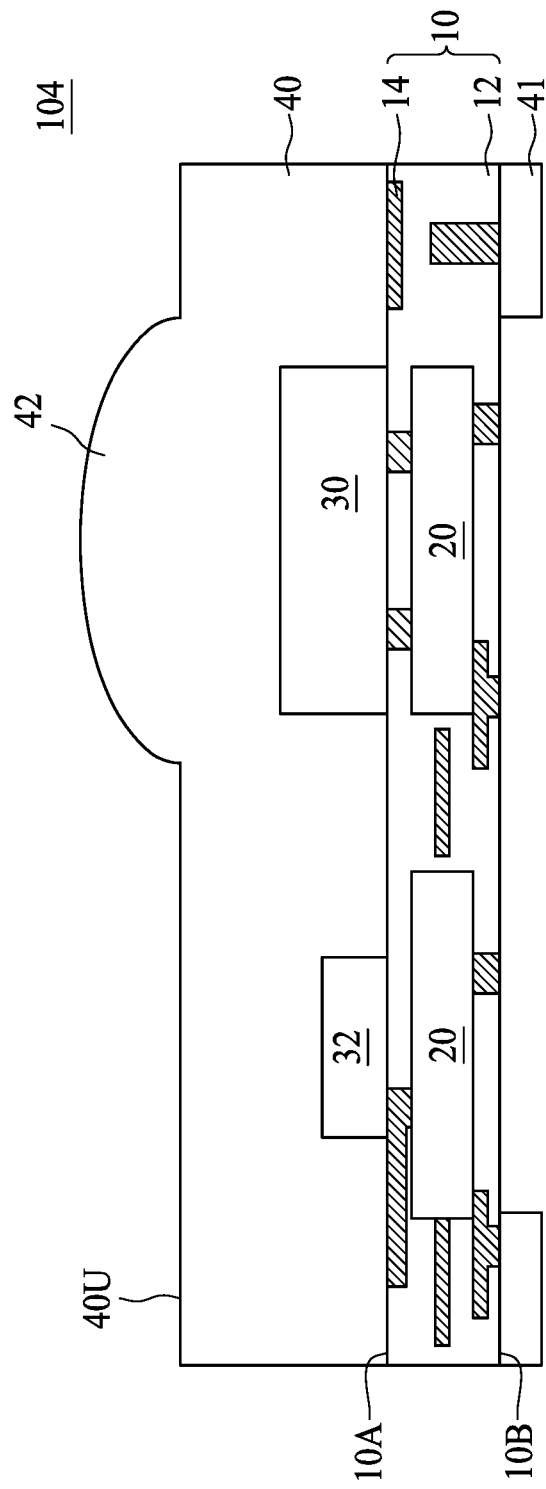
FIG. 1E is a schematic cross-sectional view of an optical device package in accordance with some embodiments of the present disclosure.

FIG. 1E is a schematic cross-sectional view of an optical device package 104 in accordance with some embodiments of the present disclosure. As shown in FIG. 1E, in contrast to the optical device package 103 of FIG. 1D, the optical device package 104 may further include a warpage compensating structure 41 disposed on the surface 10B of the substrate 10. The coefficient of thermal expansion (CTE) of the warpage compensating structure 41 and that of the clear encapsulation layer 40 may be selected to compensate the warpage of the optical device package 104. In some embodiments, the CTE of the warpage compensating structure 41 is substantially equal to that of the clear encapsulating layer 40. In some embodiments, the CTE of the warpage compensating structure 41 may be larger or less than that of the clear encapsulating layer 40. The material of the warpage compensating structure 41 may be the same as or different from that of the clear encapsulating layer 40. The warpage compensating structure 41 may partially cover the surface 10B of the substrate 10. For example, the warpage compensating structure 41 may have a frame shape, and disposed at a peripheral region of the surface 10B of the substrate 10. The warpage compensating structure 41 may have a continuous frame shape, or a discontinuous frame shape formed from a plurality of disconnected compensating pieces.

Figure 1F:
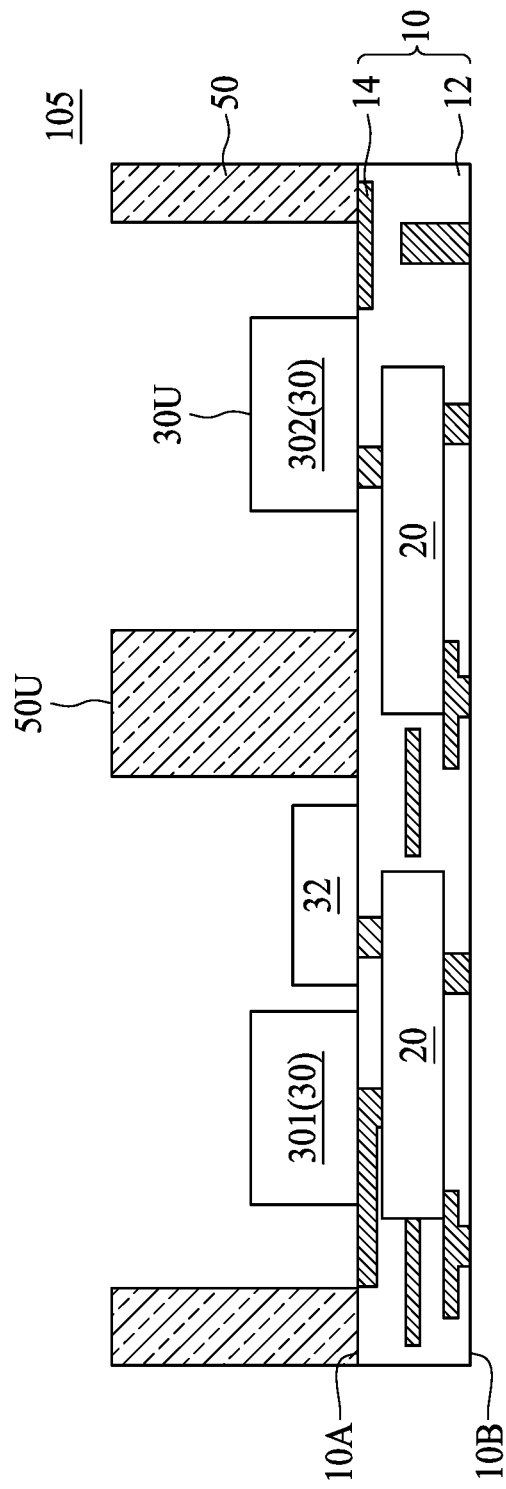
FIG. 1F is a schematic cross-sectional view of an optical device package in accordance with some embodiments of the present disclosure.

FIG. 1F is a schematic cross-sectional view of an optical device package 105 in accordance with some embodiments of the present disclosure. As shown in FIG. 1F, in contrast to the optical device package 100 of FIG. 1A, the optical device package 105 may further include an opaque isolation structure 50 disposed on the surface 10A of the substrate 10. In some embodiments, the opaque isolation structure 50 is disposed adjacent to the optical devices 30, and laterally surrounds the optical devices 30. The opaque isolation structure 50 are formed by light absorbing material or light blocking material, which does not allow light beams passing. The opaque isolation structure 50 may include black molding material such as black resin, or molding material with black fillers. In some embodiments, the optical devices 30 include a light emitting device 301 and a light detecting device 302. The optical device package 105 may include a plurality of electronic chips 32, where one of the electronic chips 32 is electrically connected to the light emitting device 301 to control the light emitting device, and another one of the electronic chips 32 is electrically connected to the light detecting device 302 to control the detecting device 302. The opaque isolation structure 50 may be a frame structure confining one or more spaces. The opaque isolation structure 50 may laterally surround the light emitting device 301 and the light detecting device 302 such that the light emitting device 301 and the light detecting device 302 are confined in the spaces respectively. The opaque isolation structure 50 isolates the light emitting device 301 from the light detecting device 302 in the lateral direction. Accordingly, optical crosstalk or interference between the light emitting device 301 and the light detecting device 302 can be inhibited. In some embodiments, an upper surface 50U of the opaque isolation structure 50 may substantially leveled with or higher than an upmost surface 30U of the optical device 30 to enhance isolation effect.

Figure 1G:
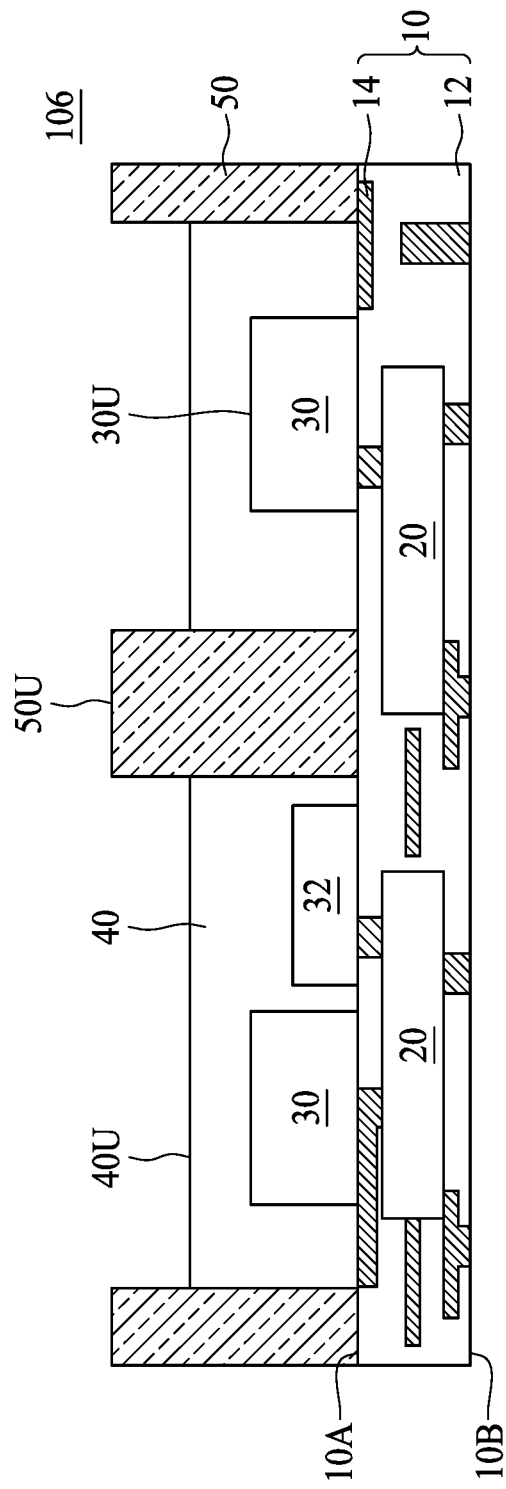
FIG. 1G is a schematic cross-sectional view of an optical device package in accordance with some embodiments of the present disclosure.

FIG. 1G is a schematic cross-sectional view of an optical device package 106 in accordance with some embodiments of the present disclosure. As shown in FIG. 1G, in contrast to the optical device package 105 of FIG. 1F, the optical device package 106 may further include the clear encapsulation layer 40 disposed on the surface 10A of the substrate 10, and encapsulating the optical devices 30 and the electronic component 32 (if exists). The clear encapsulation layer 40 may be separated by the opaque isolation structure 50.

Figure 1H:
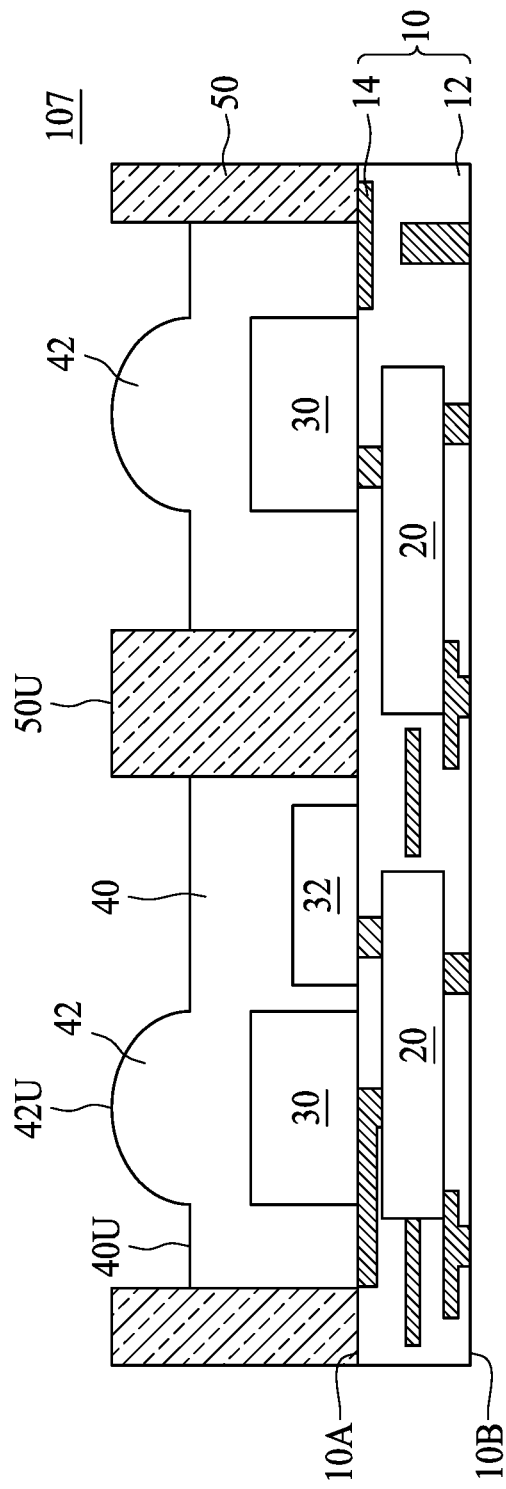
FIG. 1H is a schematic cross-sectional view of an optical device package in accordance with some embodiments of the present disclosure.

FIG. 1H is a schematic cross-sectional view of an optical device package 107 in accordance with some embodiments of the present disclosure. As shown in FIG. 1H, in contrast to the optical device package 106 of FIG. 1G, the optical device package 107 may further include one or more optical lenses 42 extending from the upper surface 40U of the clear encapsulation layer 40. In some embodiments, the upper surface 50U of the opaque isolation structure 50 may be substantially leveled with or higher than an upmost surface 42U of the optical lens 42 to enhance isolation effect.

Figure 1I:
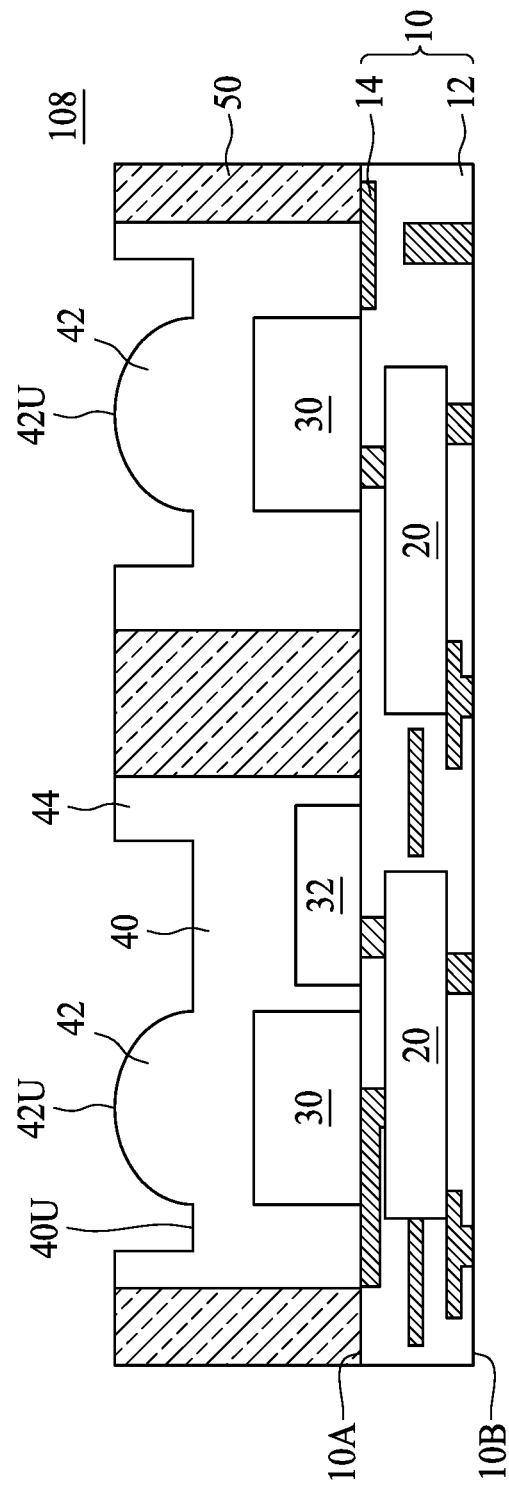
FIG. 1I is a schematic cross-sectional view of an optical device package in accordance with some embodiments of the present disclosure.

FIG. 1I is a schematic cross-sectional view of an optical device package 108 in accordance with some embodiments of the present disclosure. As shown in FIG. 1I, in contrast to the optical device package 107 of FIG. 1H, the clear encapsulation layer 40 of the optical device package 108 may further include a dam structure 44 extending from the upper surface 40U of the clear encapsulation layer 40, and laterally surrounding the opaque isolation structure 50. The opaque isolation structure 50 may include liquid-based material, and the dam structure 44 may be used as a dam defining a trench for confining the liquid-based material during process, thereby avoiding overflow of the liquid-based material that may contaminate the optical devices 30 and the optical lenses 42. In some embodiments, the optical lenses 42, the clear encapsulation layer 40 and/or the dam structure 44 may be formed monolithically and integrally, for example, by the same molding process.

Figure 1J:
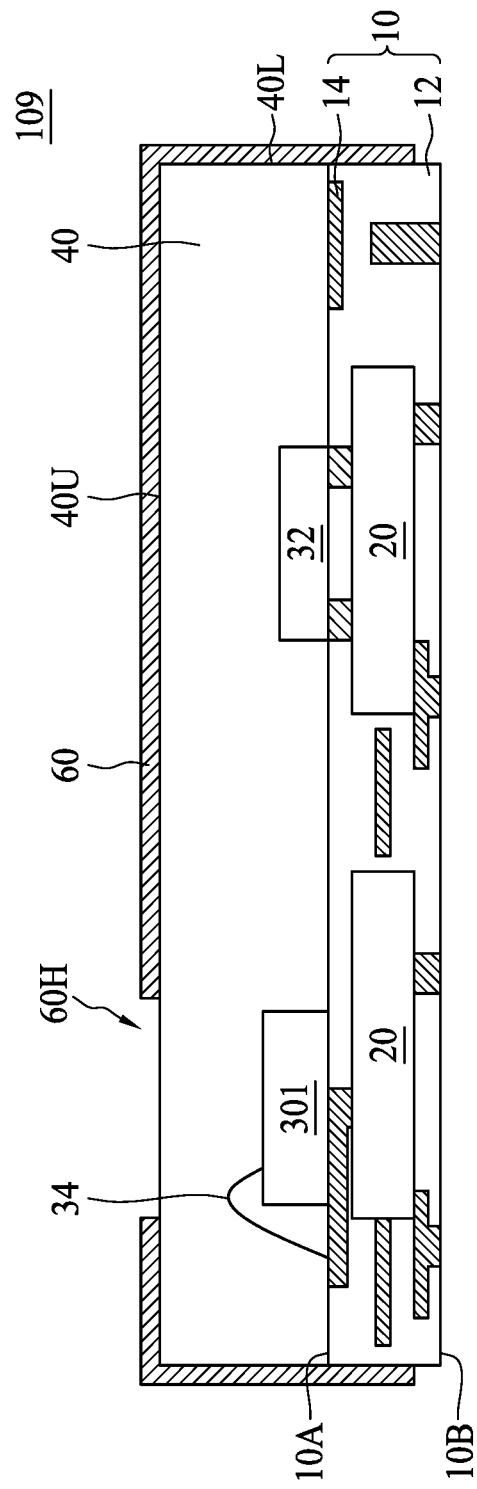
FIG. 1J is a schematic cross-sectional view of an optical device package in accordance with some embodiments of the present disclosure.

FIG. 1J is a schematic cross-sectional view of an optical device package 109 in accordance with some embodiments of the present disclosure. As shown in FIG. 1J, in contrast to the optical device package 101 of FIG. 1B, the optical device package 109 may further include a patterned reflective layer 60 disposed on the upper surface 40 of the clear encapsulation layer 40. In some embodiments, the patterned reflective layer 60 may further cover lateral surface 40L of the clear encapsulation layer 40. The patterned reflective layer 60 may include a conductive material such as metal or alloy, and can help to shield the optical devices 30 and the electronic chips 20 from external interference such as EMI. The patterned reflective layer 60 may further enhance heat dissipation of the optical device package 101. The patterned reflective layer 60 may include one or more openings 60H substantially aligned with at least a portion of the one or more optical devices 30 to pass light beams emitted from or received by the one or more optical devices in a vertical direction. For example, when the optical devices 30 include a light emitting device, the light beams emitted from the light emitting device can pass through the opening 60H; when optical devices 30 include a light detecting device, external light beams can pass through the opening 60H and be detected by the light detecting device.

Figure 1K:
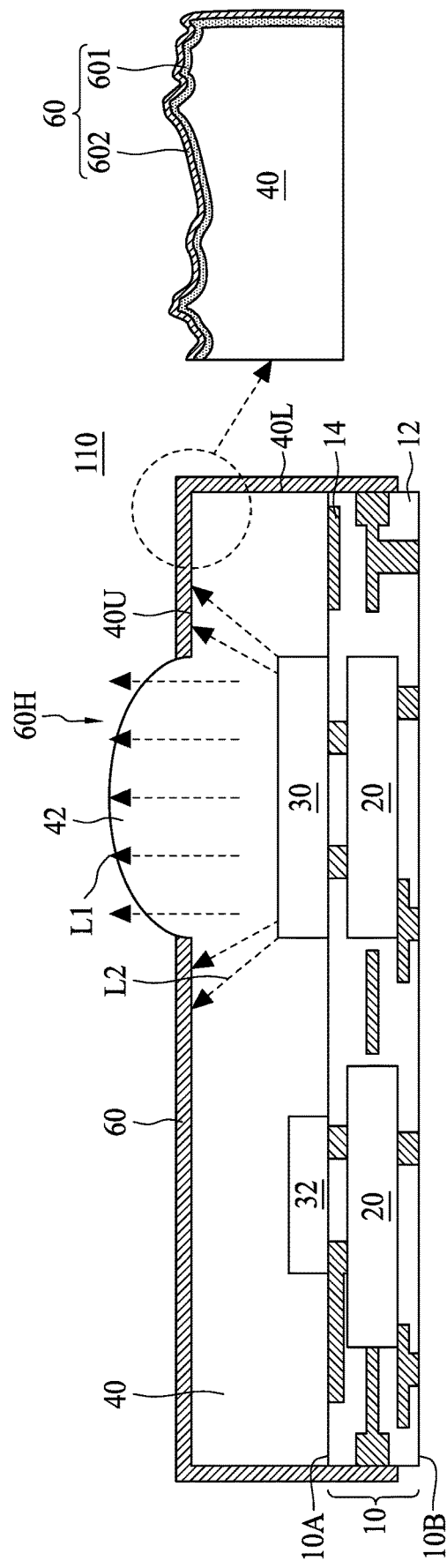
FIG. 1K is a schematic cross-sectional view of an optical device package in accordance with some embodiments of the present disclosure.

FIG. 1K is a schematic cross-sectional view of an optical device package 110 in accordance with some embodiments of the present disclosure. As shown in FIG. 1K, in contrast to the optical device package 110 of FIG. 1J, the patterned reflective layer 60 and the clear encapsulation layer 40 of the optical device package 111 may include a rough interface (as shown in the enlarged view of FIG. 1L). The rough interface may be configured to scatter the light beams L2 emitted from the optical device 30 in an inclined direction, and therefore alleviate secondary reflection in the clear encapsulation layer 40. In some embodiments, the patterned reflective layer 60 may include a plurality of layers such as a first layer 601 and a second layer 602. The first layer 601 may be a patterned layer with a plurality of discontinuous blocks separated by gaps. The second layer 602 may cover both the discontinuous blocks and gaps. Accordingly, a rough interface may be formed between the clear encapsulation layer 40 and the patterned reflective layer 60. The first layer 601 and the second layer 602 may be made of light-shielding material such as metal or alloy. For example, the first layer 601 may include stainless steel, and the second layer 602 may include copper.

Figure 1L:
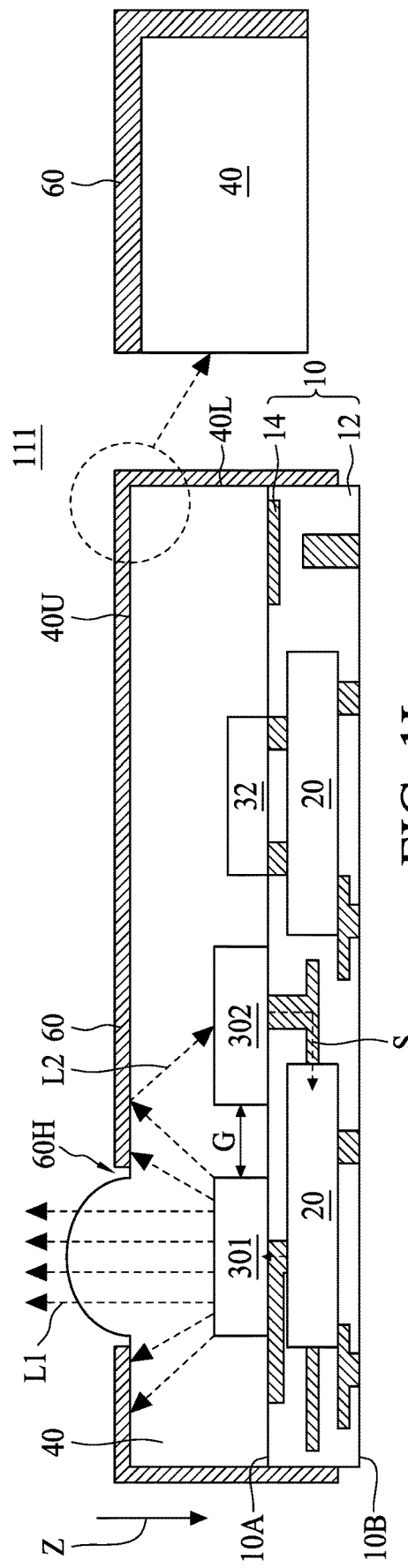
FIG. 1L is a schematic cross-sectional view of an optical device package in accordance with some embodiments of the present disclosure.

FIG. 1L is a schematic cross-sectional view of an optical device package 111 in accordance with some embodiments of the present disclosure. As shown in FIG. 1L, the optical device package 111 includes a light emitting device 301, a light detecting device 302, one or more electronic chips 20, a clear encapsulation layer 40 and a patterned reflective layer 60. The light emitting device 301 and the light detecting device 302 may be both disposed on the surface 10A of the substrate 10, and have a gap G therebetween. The one or more electronic chips 20 at least partially embedded in the substrate 10, and electrically connected to the light emitting device 301 and the light detecting device 302. The electronic chips 32 may be entirely embedded in the substrate. In some embodiments, the optical device package 110 may include a plurality of electronic chips 32, where one of the electronic chips 32 is electrically connected to the light emitting device 301 to control the light emitting device, and another one of the electronic chips 32 is electrically connected to the light detecting device 302 to control the detecting device 302. In some other embodiments, the light emitting device 301 and the light detecting device 302 may be electrically connected to the same electronic chip 20 and controlled by the same electronic chip 20. In some embodiments, the optical device package 111 may further include one or more electronic components 32 disposed on the surface 10A of the substrate 10. The electronic component 32 may include active electronic component, or passive electronic component such as resistors, inductors or capacitors electrically connected to the electronic chips 20 through the circuit layers 14.

The clear encapsulation layer 40 is disposed on the surface 10A of the substrate 10 and encapsulating the light emitting device 301 and the light detecting device 302. The patterned reflective layer 60 is disposed on an upper surface 40U of the clear encapsulation layer 40. The patterned reflective layer 60 at least partially exposes the light emitting device 301, and at least overlaps the gap G between the light emitting device 301 and the light detecting device 302 in a projection direction Z perpendicular to the surface 10A of the substrate 10. By way of example, the patterned reflective layer 60 includes an opening 60H (e.g., a first opening) substantially aligned with the light emitting device 301, and the patterned reflective layer 60 may cover the rest portion of the clear encapsulation layer 40 including lateral surfaces 40L of the clear encapsulation layer 40. The opening 60H of the patterned reflective layer 60 allows the light beams L1 emitted from the light emitting device 301 in a vertical direction passing through the opening 60H. The clear encapsulation layer 40 may further include one or more optical lenses 42 substantially aligned with the light emitting device 301. The pattern reflective layer 60 and the clear encapsulation layer 40 may include a smooth interface for reflecting the light beams L2 emitted from the light emitting device 301 in an inclined direction to the light detecting device 302. A portion of light beams L2 emitted from the light emitting device 301 is reflected by the patterned reflective layer 60 to the light detecting device 302 to generate an electrical signal S, and the electrical signal S is fed to the one or more electronic chips 32 to control of the light emitting device 301. By way of example, the electrical signal S generated by the light detecting device 302 due to the reflected light beams L2 can be fed back to the electronic chips 20 through the circuit layers 14 to check and/or modify parameters such as wavelength and brightness of the light emitting device 301.

Figure 1M:
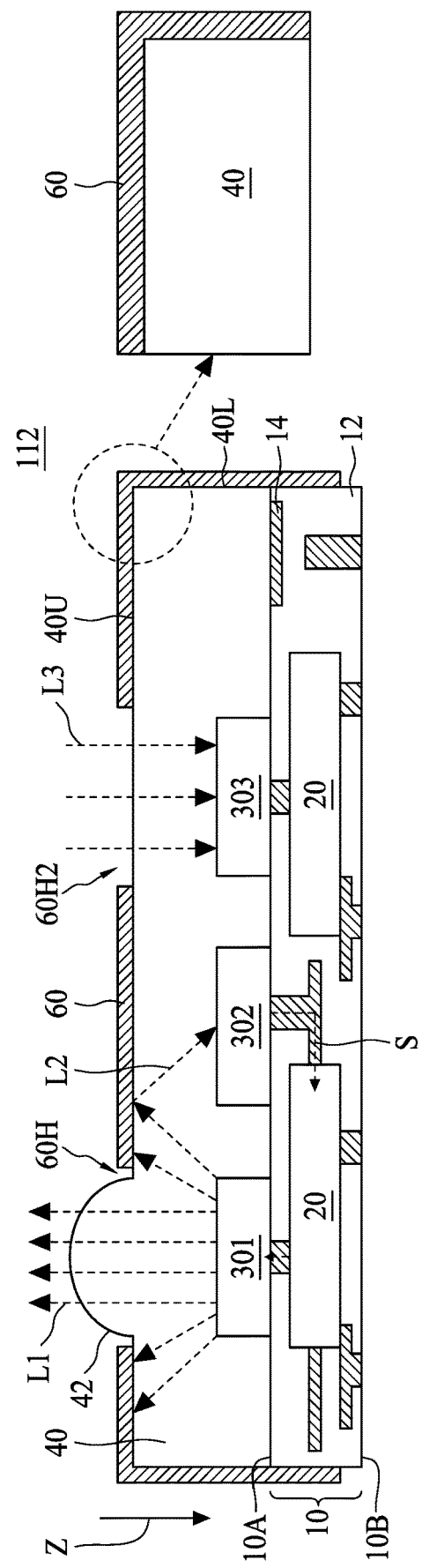
FIG. 1M is a schematic cross-sectional view of an optical device package in accordance with some embodiments of the present disclosure.

FIG. 1M is a schematic cross-sectional view of an optical device package 112 in accordance with some embodiments of the present disclosure. As shown in FIG. 1M, in contrast to the optical device package 111 of FIG. 1L, the optical device package 112 may include a plurality of light detecting devices such as the light detecting device (e.g., a first light detecting device) 302, and a second light detecting device 303 disposed on the surface 10A of the substrate 10 and apart from the light detecting device 302. The patterned reflective layer 60 may include the opening (e.g., a first opening) 60H substantially aligned with the light emitting device 301, and a second opening 60H2 substantially aligned with the second light detecting device 303. The patterned reflective layer 60 may further overlap the light detecting device 301 in the projection direction Z. The second opening 60H2 can allow light beams L3 such as ambient light beam passing such that the second light detecting device 303 can detect the light beams L3. The electrical signal S generated by the second light detecting device 303 can be fed to the one or more electronic chips 32 and may be compared with the electrical signal S generated by the light detecting device 302 to control of the light emitting device 301.

Figure 1N:
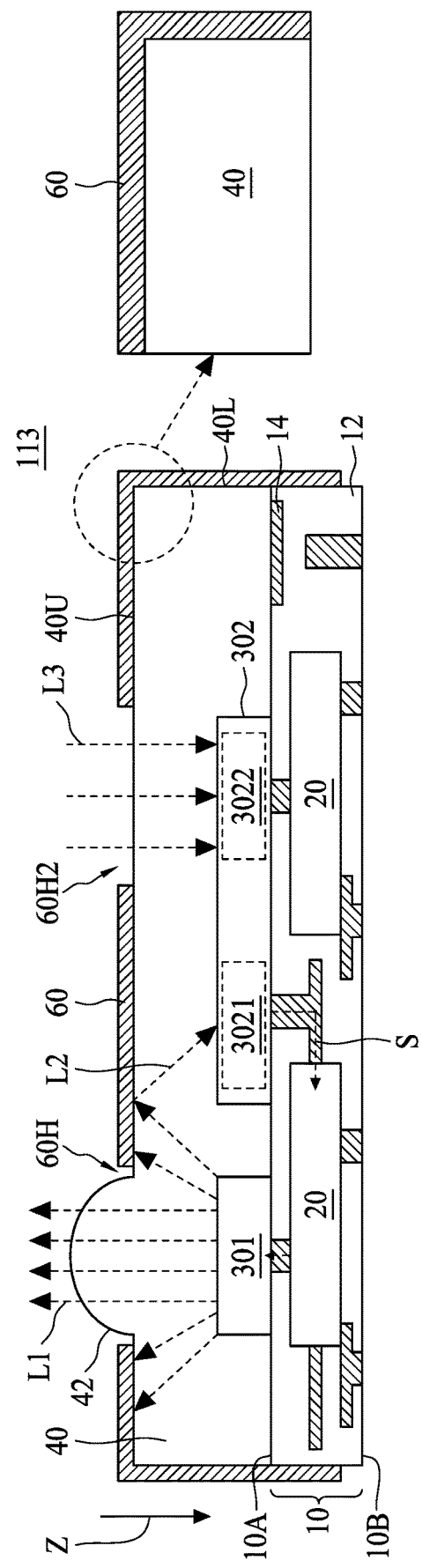
FIG. 1N is a schematic cross-sectional view of an optical device package in accordance with some embodiments of the present disclosure.
Figure 10:
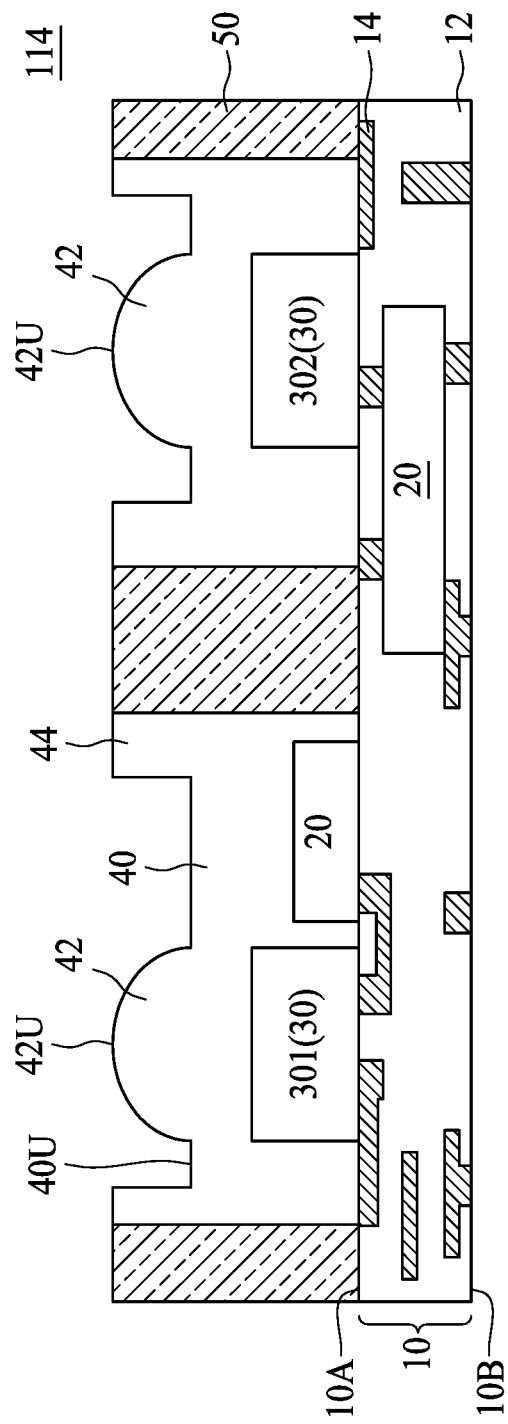

FIG. 1N is a schematic cross-sectional view of an optical device package 113 in accordance with some embodiments of the present disclosure. As shown in FIG. 1N, in contrast to the optical device package 112 of FIG. 1M, the light detecting device 113 of the optical device package 113 include a first light detecting component 3021 and a second light detecting component 3022. The first light detecting component 3021 and the second light detecting component 3022 may be two different light detecting components or light detecting regions integrally formed in the same light detecting device. The patterned reflective layer includes a first opening 60H substantially aligned with the light emitting device 301, and a second opening 60H2 substantially aligned with the second light detecting component 3022. The patterned reflective layer 60 further overlaps the first light detecting component 3021 in the projection direction Z. The electrical signal S generated by the second light detecting component 3022 can be fed to the one or more electronic chips 32 and may be compared with the electrical signal S generated by the first light detecting component 3021 to control of the light emitting device 301.

FIG. 1O is a schematic cross-sectional view of an optical device package 114 in accordance with some embodiments of the present disclosure. As shown in FIG. 1O, in contrast to the optical device package 108 of FIG. 1I, the optical devices 30 of the optical device package 114 includes a light emitting device 301 and a light detecting device 302 both disposed on the surface 10A of the substrate 10. The electronic chips 32 include a first electronic chip 321 at least partially embedded in the substrate 10, and a second electronic chip 322 disposed on the surface 10A of the substrate 10. The first electronic chip 321 can be electrically connected to one of the light emitting device 301 and the light detecting device 302, while the second electronic chip 322 can be electrically connected to the other one of the light emitting device 301 and the light detecting device 302. The first electronic chip 321 may be partially or entirely embedded in the substrate 10. The clear encapsulation layer 40 is disposed on the surface 10A of the substrate 10 and encapsulating the light emitting device 301 and the light detecting device 302. The opaque isolation structure 50 is disposed between the light emitting device 301 and the light detecting device 302. At least one optical lens 42 may be disposed on at least one of the light emitting device 301 and the light detecting device 302. In some embodiments, two optical lenses 42 may be disposed on the light emitting device 301 and the light detecting device 302, respectively.

In some embodiments, an upper surface 50U of the opaque isolation structure 50 may be substantially leveled with or higher than an upmost surface 42U of the one or more optical lenses 42 to enhance isolation effect. The clear encapsulation layer 40 may further include a dam structure 44 extending from an upper surface 40U of the clear encapsulation layer 40, and laterally surrounding the opaque isolation structure 50. The opaque isolation structure 50 may include liquid-based material, and the dam structure 44 may be used as a dam defining a trench for confining the liquid-based material during process, thereby avoiding overflow of the liquid-based material that may contaminate the optical devices 30 and the optical lenses 42. In some embodiments, the optical lenses 42, the clear encapsulation layer 40 and/or the dam structure 44 may be formed monolithically and integrally, for example, by the same molding process.

Figure 2A:
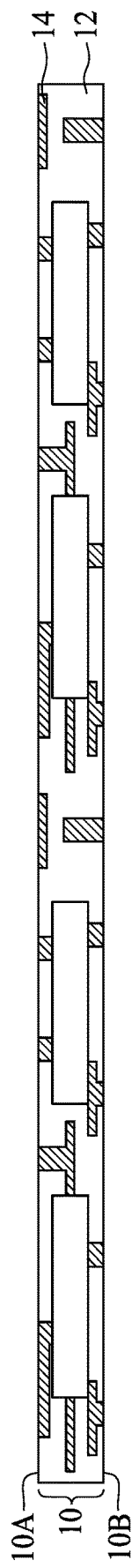
FIG. 2A, FIG. 2B, FIG. 2C and FIG. 2D illustrate operations of manufacturing an optical device package in accordance with some embodiments of the present disclosure.

FIG. 2A, FIG. 2B, FIG. 2C and FIG. 2D illustrate operations of manufacturing an optical device package in accordance with some embodiments of the present disclosure. As shown in FIG. 2A, a substrate 10 is received. The substrate 10 includes one or more circuit layers 14. The circuit layers 14 may be stacked to one another, and dielectric layer(s) 12 may be interposed between adjacent circuit layers 14. In some embodiments, the circuit substrate 10 may include a semiconductor-based circuit substrate. For example, the circuit substrate 10 may include base material such as semiconductor material, dielectric material such as inorganic and/or organic dielectric material, and conductive material such as metal, and formed by semiconductor processes. The electronic chips 20 can be embedded during fabrication of the substrate 10. In some other embodiments, the substrate 10 may include a lead frame with circuit layers 14 and dielectric layers 12 formed thereon. The electronic chips 20 can be embedded during fabrication of the lead frame and the dielectric layers 12.

Figure 2B:
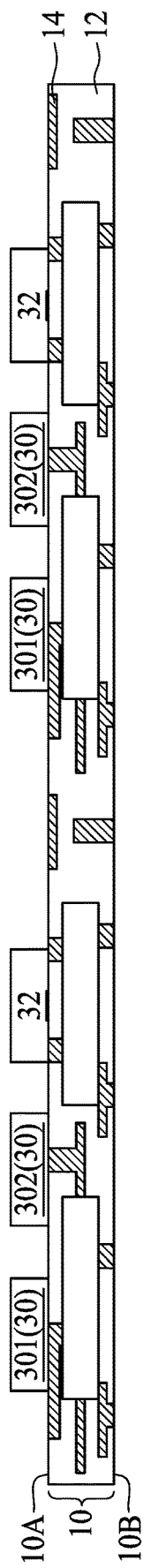

As shown in FIG. 2B, a plurality of optical devices 30 are formed on the surface 10A of the substrate 10, and electrically connected to the electronic chips 20 through at least a portion of the circuit layers 14. In some embodiments, the optical devices 30 may include a plurality pairs of light emitting device 301 and light detecting device 302. In some other embodiments, the optical devices 30 may include a plurality groups of light emitting device 301, light detecting device 302 and second light detecting device 303 as shown in FIG. 1M. In still some other embodiments, the optical devices 30 may include a plurality pairs of light emitting device 301 and light detecting device 302, where each light detecting device 302 may include a first light detecting component 3021 and a second light detecting component 3022 as shown in FIG. 1N.

In some embodiments, the optical devices 30 may include surface mount devices (SMDs) and formed on the surface 10A of the substrate 10 by surface mounting technology (SMT). In some embodiments, a plurality of electronic components 32 such as passive electronic components may be optionally formed on the surface 10A of the substrate 10.

Figure 2C:
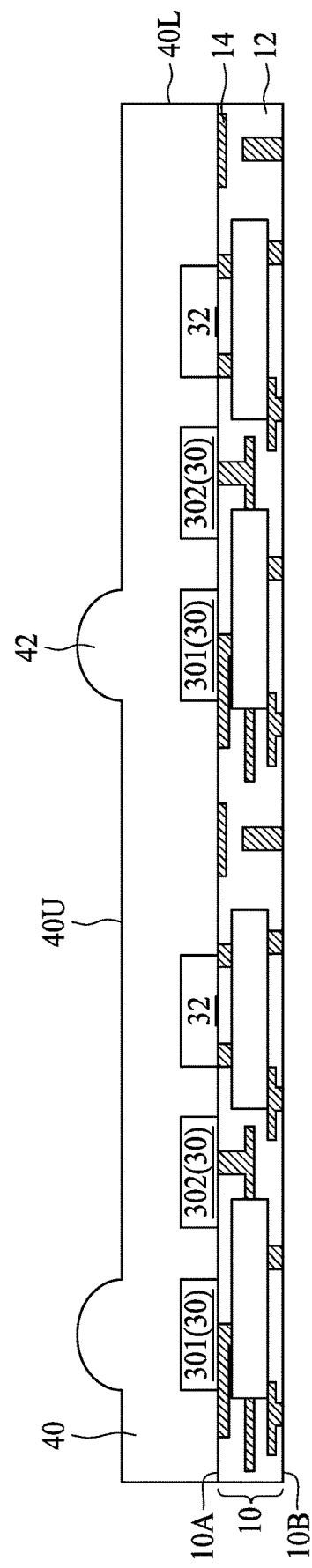

As shown in FIG. 2C, a clear encapsulation layer 40 may be formed on the surface 10A of the substrate 10 to encapsulating the optical devices 30 and the electronic components 32. The clear encapsulation layer 40 may be formed by molding using a mold, dispensing and curing or other suitable processes. In some embodiments, the optical lenses 42 may be formed on the clear encapsulation layer 40. For examples, the optical lenses 42 can be formed simultaneously with the clear encapsulation layer 40 by molding. In some embodiments, the clear encapsulation layer 40 includes a flat interface.

Figure 2D:
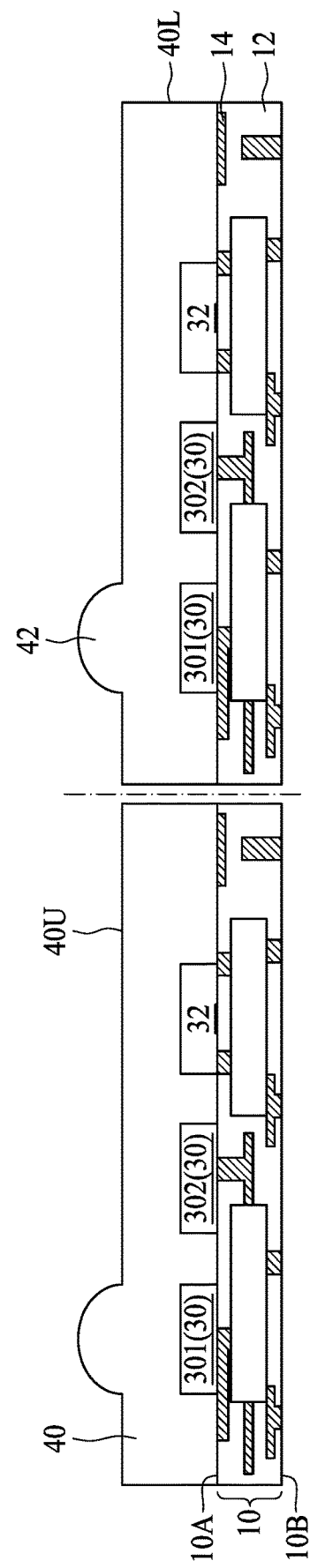

As shown in FIG. 2D, a patterned reflective layer 60 is formed on the clear encapsulation layer 40 and a singulation is performed. The patterned reflective layer 60 may be formed by selective coating, or patterned to form a plurality of openings 60H aligned with the optical devices 30, e.g., the light emitting devices 301. In some embodiments, the patterned reflective layer 60 may be formed subsequent to the singulation in case the patterned reflective layer 60 should be extending to the lateral surface 40L of the clear encapsulation layer 40. By way of examples, after the substrate 10 is singulated, the patterned reflective layer 60 is selectively coated on the upper surface 40U and the lateral surface 40L to form the optical device package as illustrated in FIG. 1L. In case the second light detecting devices 303 are formed on the substrate 10, the substrate 10 can be singulated and the patterned reflective layer 60 can be selectively coated to form the optical device package as illustrated in FIG. 1M. In case the light detecting device 302 includes the first light detecting component 3021 and the second light detecting component 3022, the substrate 10 can be singulated and the patterned reflective layer 60 can be selectively coated to form the optical device package as illustrated in FIG. 1N. In some other embodiments, the patterned reflective layer 60 may be formed prior to the singulation.

Figure 3A:
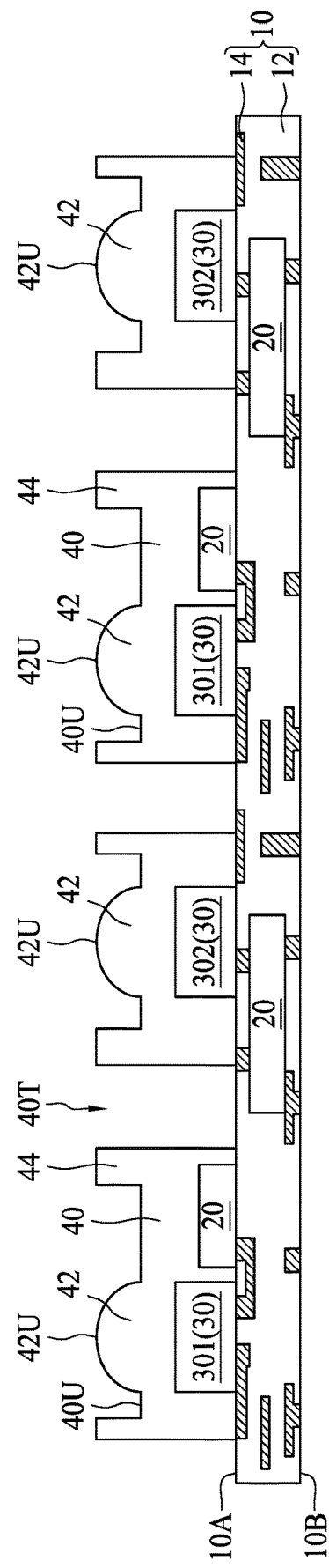
FIG. 3A and FIG. 3B illustrate operations of manufacturing an optical device package in accordance with some embodiments of the present disclosure.
Figure 3B:
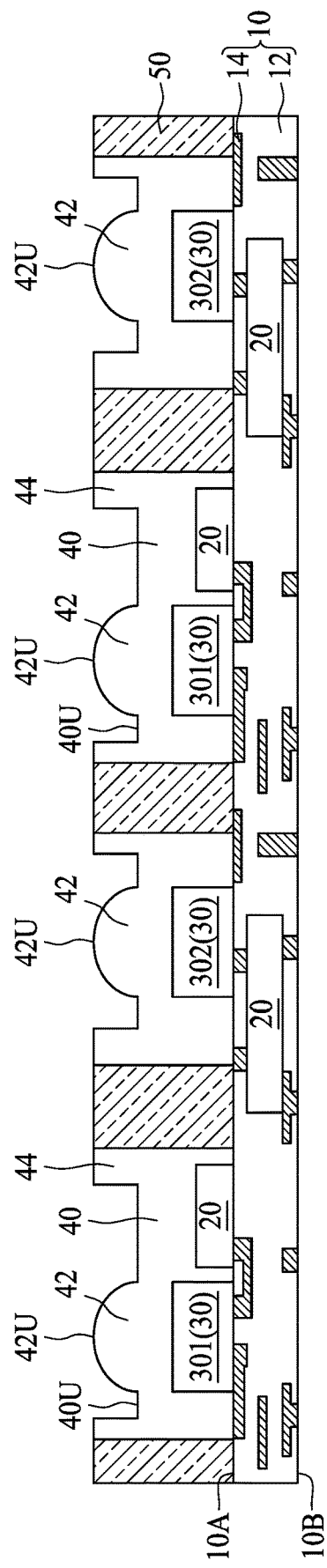

FIG. 3A and FIG. 3B illustrate operations of manufacturing an optical device package in accordance with some embodiments of the present disclosure. As shown in FIG. 3A, a substrate 10 is received. The substrate 10 includes one or more circuit layers 14. The circuit layers 14 may be stacked to one another, and dielectric layer(s) 12 may be interposed between adjacent circuit layers 14. A portion of electronic chips 20 can be embedded during fabrication of the substrate 10, and another portion of electronic chips 20 can be disposed after the substrate 10 is fabricated.

A plurality of optical devices 30 include light emitting devices 301 and light detecting devices 302 are formed on the surface 10A of the substrate 10 and electrically connected to the circuit layers 14. A clear encapsulation layer 40 may be formed on the surface 10A of the substrate 10 to encapsulating the optical devices 30 and a portion of the electronic chips 20. In some embodiments, the clear encapsulation layer 40 may include a dam structure 44 extending from the upper surface 40U of the clear encapsulation layer 40. The clear encapsulation layer 40 may be then patterned e.g., by cutting or other suitable process to form trenches 40T.

As shown in FIG. 3B, an opaque isolation structure 50 is then formed in the trenches 40T of the clear encapsulation layer 40. In some embodiments, the opaque isolation structure 50 may be formed by dispensing a liquid-based material in the trenches 40T. The dam structure 44 may be used as a dam for confining the liquid-based material in the trenches 40T during process, thereby avoiding overflow of the liquid-based material that may contaminate the optical devices 30 and the optical lenses 42. The liquid-based material can then be cured thermally or optically to form the opaque isolation structure 50. The substrate 10 can be then singulated to form the optical device package as illustrated in FIG. 1O.

In some embodiments of the present disclosure, the embedded electronic chips can reduce the volume and thickness of the optical device package, shorten electrical path between the electronic chip and the optical device, and increase thermal dissipation of the optical device package. The optical device package may further include a clear encapsulation layer encapsulating the optical device. The clear encapsulation layer can protect the optical device, and enhance thermal dissipation of the optical device package. The optical device package may further include an opaque isolation structure for providing optical and/or electrical isolation between different optical devices. The optical device package may further include a patterned reflective layer partially interfacing the clear encapsulation layer. The patterned reflective layer can reduce secondary light reflection in some embodiments, or alternatively provide a reflection path to deliver the light beams emitted from one optical device such as light emitting device to another optical device such as light detecting device for feedback control.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An optical device package, comprising:
   a substrate;
   a light emitting device disposed on the substrate;
   a first light detecting device and a second light detecting device disposed on the substrate;
   a first electronic chip and a second electronic chip at least partially embedded in the substrate and substantially separated from each other, the first and the second electronic chips being electrically connected to the light emitting device and the second light detecting device, respectively; and
   a clear encapsulation layer disposed on the surface of the substrate and encapsulating the light emitting device and the light detecting device and a patterned reflective layer disposed on the clear encapsulation layer, wherein the patterned reflective layer has a pair of openings arranged respectively over the light emitting device and the second light detecting device.

2. The optical device package of claim 1, wherein a projection area of the patterned reflective layer on the substrate overlaps a projection area of the first light detecting device on the substrate.

3. The optical device package of claim 1, wherein the first light detecting device interposes between the light emitting device and the second light detecting device.

4. The optical device package of claim 3, wherein the light emitting device, the first light detecting device, and the second light detecting device are located in a same optical chamber.

5. The optical device package of claim 1, wherein the first electronic chip is further electrically connected to the first light detecting device.

6. An optical device package, comprising:
   a substrate;
   a light emitting device disposed on the substrate;
   a first light detecting device and a second light detecting device disposed on the substrate;
   a first electronic chip and a second electronic chip at least partially embedded in the substrate and substantially separated from each other, the first and the second electronic chips being electrically connected to the light emitting device and the second light detecting device, respectively; and
   a patterned reflective layer, wherein a side surface of the substrate is partially covered by the patterned reflected layer while partially exposed from the patterned reflected layer.

7. An optical device package, comprising:
   a substrate;
   a light emitting device disposed on the substrate;
   a first light detecting device and a second light detecting device disposed on the substrate; and
   a first electronic chip and a second electronic chip at least partially embedded in the substrate and physically separated from each other, the first and the second electronic chips being electrically connected to the light emitting device and the second light detecting device, respectively, the first electronic chip further electrically connected to the first light detecting device, and configured to adjust power of the light emitting device based on signal from the first light detecting device.

8. The optical device package of claim 7, further comprising a shielding layer electrically connected to the substrate, wherein the shielding layer covers the first light detecting device while exposing the light emitting device and the second light detecting device.

9. The optical device package of claim 7, wherein the first light detecting device is configured to receive an internally reflected light from the light emitting device, while the second light detecting device is configured to receive an externally reflected light from the light emitting device.

* * * * *